(12) United States Patent
Fan et al.

(10) Patent No.: US 8,748,208 B2
(45) Date of Patent: Jun. 10, 2014

(54) METHOD FOR FABRICATING THERMO-ELECTRIC GENERATOR

(75) Inventors: Ping Fan, Shenzhen (CN); Dong-Ping Zhang, Shenzhen (CN); Zhuang-Hao Zheng, Shenzhen (CN); Guang-Xing Liang, Shenzhen (CN)

(73) Assignee: Shenzhen University, Guangdong (CN)

( * ) Notice: Subject to any disclaimer, the term of this patent is extended or adjusted under 35 U.S.C. 154(b) by 236 days.

(21) Appl. No.: 13/145,207

(22) PCT Filed: Dec. 9, 2009

(86) PCT No.: PCT/CN2009/075422
§ 371 (c)(1),
(2), (4) Date: Sep. 16, 2011

(87) PCT Pub. No.: WO2010/083706
PCT Pub. Date: Jul. 29, 2010

(65) Prior Publication Data
US 2012/0064656 A1 Mar. 15, 2012

(30) Foreign Application Priority Data
Jan. 20, 2009 (CN) .......................... 2009 1 0105173

(51) Int. Cl.
*H01L 21/4763* (2006.01)
*H01L 31/04* (2014.01)

(52) U.S. Cl.
USPC .................................... 438/54; 257/E21.297

(58) Field of Classification Search
USPC ..................................... 438/54; 257/E21.297
See application file for complete search history.

(56) References Cited

U.S. PATENT DOCUMENTS

2006/0151021 A1* 7/2006 Stark ............................. 136/205

* cited by examiner

*Primary Examiner* — Mary Wilczewski
*Assistant Examiner* — Toniae Thomas
(74) *Attorney, Agent, or Firm* — Che-Yang Chen; Law Office of Michael Chen

(57) ABSTRACT

For the present invention, a P-type thermo-electric thin-film layer and a N-type thermo-electric thin-film layer are respectively deposited on two sides of an insulating substrate. During the deposition, the P-type thermo-electric thin-film layer and the N-type thermo-electric thin-film layer are deposited and connected on the same exposed side of the insulating substrate, and then a PN junction is formed. This method makes the fabrication simplified without special process for connecting the P-type thermo-electric thin-film layer and the N-type thermo-electric thin-film layer. Due to the features of thin-film thermo-electric material, the performance of thermo-electric generator is improved. During the deposition, the P-type thermo-electric thin-film layer and the N-type thermo-electric thin-film layer are deposited and connected on the exposed side of the insulating substrate, so welding is not required in this heating surface side. The performance of thermo-electric generator fabricated in heating surface working temperature is accordingly greatly improved.

4 Claims, 6 Drawing Sheets

METHOD FOR FABRICATING THERMO-ELECTRIC GENERATOR

FIELD OF THE INVENTION

This invention relates to thermo-electric technology, and more particularly to a method for fabricating a thermo-electric generator.

BACKGROUND OF THE INVENTION

The thermo-electric generator is a kind of generator made on the basis of temperature differences, and the heat energy is transformed into electric energy due to Seeback effect. The working principle of thermo-electric generator is that connecting one end of two different metals or two different types of thermo-electric conversion materials P-type and N-type semiconductors, placing this end in high temperature condition, and placing the other end in low temperature condition. Compared with the other end, the end in high temperature condition has better thermal activation and higher density of electrons and holes, and the electrons and holes spread to the end in low temperature condition, such that an electric potential difference is formed in the end in low temperature condition. Combining a number of this kind of thermo-electric conversion materials P-type and N-type semiconductors to form a module supplying adequate voltage, this module becomes a thermo-electric generator.

The thermo-electric generator is a kind of clean, noiseless energy without discharging any hazardous substance, having high reliability and long useful time, and supplying long, safe and continuous table electricity output. Presently the thermo-electric generator is made by cutting and welding the thermo-electric materials. There are two types of fabrication methods. In the first method, a photosensitive resist is painted on the same chip, then P-type and N-type areas are formed through double photo etching respectively, and finally P-type and N-type thermo-electric materials are deposited in the P-type and N-type area respectively. This method is difficult for application, especially for the procedure of combining thermo-electric units in which the chip is required to be stripped from the deposited thermo-electric units. In the second method, P-type and N-type thermo-electric unit chips are separately manufactured. In the fabrication of micro thin-film thermo-electric generator, the conducting layer connecting P-type and N-type thermo-electric units can be manufactured assuming that the chip is not stripped from the deposited thermo-electric units. This method has complicated procedures. The thin-film of the thermo-electric generator is merely limited to single thin-film connecting P-type and N-type thermo-electric units, and then the performance is limited.

SUMMARY OF THE INVENTION

To solve the above-mentioned problem, this invention provides a thin-film thermo-electric generator and fabrication method thereof for improving the performance and simplifying the fabrication processes.

The technical solutions of the present invention are as follows.

A method for fabricating a thermo-electric generator comprises steps as follows: putting an insulating substrate in the fixture in the deposition room; exposing one side of the insulating substrate, sheltering all the other sides, setting the insulating substrate in an specific angle for deposition on the exposed side of the insulating substrate; depositing a P-type thermo-electric thin-film layer on one side of the insulating substrate; depositing a N-type thermo-electric thin-film layer on the other side of the insulating substrate; connecting said P-type thermo-electric thin-film layer and N-type thermo-electric thin-film layer on the exposed side of said substrate; and extracting an electrode respectively from said P-type thermo-electric thin-film layer and N-type thermo-electric thin-film layer to form a main structure of a thin-film thermo-electric generator.

Preferably, the thickness range of said substrate is 0.1 mm-100 mm, the thickness range of said P-type thermo-electric thin-film layer is 1 nm-10 μm, and the thickness range of said N-type thermo-electric thin-film layer is 1 nm-10 μm.

Preferably, the shape of said substrate is regular rectangle.

Preferably, the shape of exposed sides of said substrate is plane or curve.

For the thermo-electric generator and fabrication method of this invention, a P-type thermo-electric thin-film layer and a N-type thermo-electric thin-film layer are respectively deposited on two sides of a insulating substrate. During the deposition, the P-type thermo-electric thin-film layer and the N-type thermo-electric thin-film layer are deposited and connected on the same exposed side of the insulating substrate, and then a PN junction is formed. This method makes the fabrication simplified without special process for connecting the P-type thermo-electric thin-film layer and the N-type thermo-electric thin-film layer. Due to the features of thin-film thermo-electric material, the performance of thermo-electric generator is greatly improved. During the deposition, the P-type thermo-electric thin-film layer and the N-type thermo-electric thin-film layer are deposited and connected on the exposed side of the insulating substrate, so welding is not required in this heating surface side, and the performance of thermo-electric generator fabricated in heating surface working temperature is accordingly greatly improved.

DETAILED DESCRIPTION OF ILLUSTRATIVE EMBODIMENTS

In the embodiment, the present invention provides a thin-film thermo-electric generator and a fabrication method thereof. To make the technical solutions of the present invention more comprehensible, the present invention is described in detail with reference to the accompanying drawings and embodiments as follows.

Figure 1:
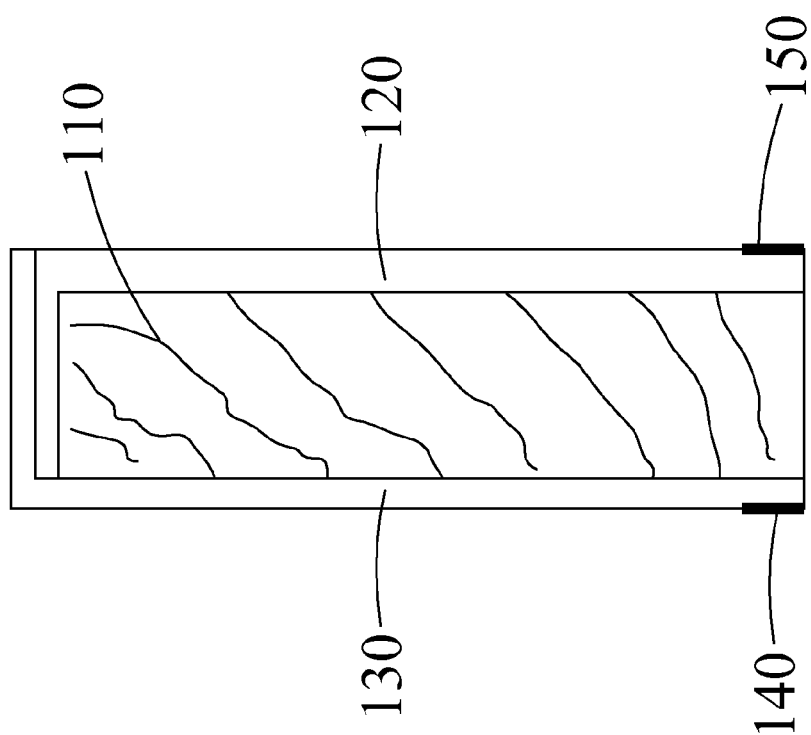
FIG. 1 is a cross-sectional diagram of the fabrication process of the thermo-electric generator in a first embodiment of the invention.
Figure 2A:
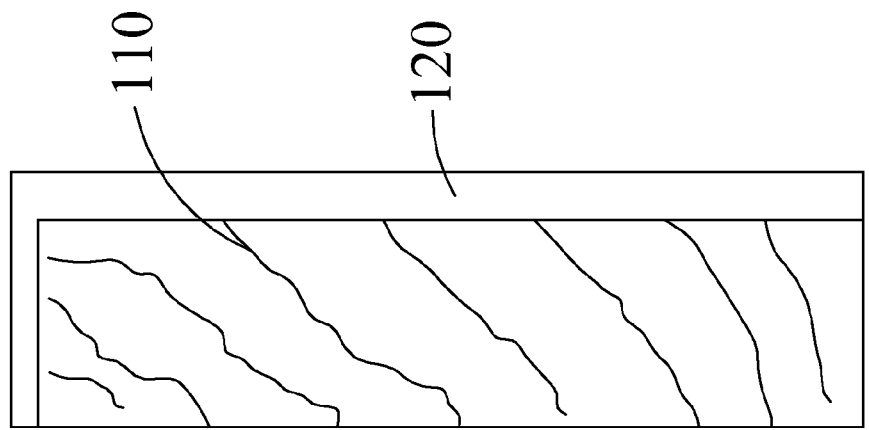
FIGS. 2a and 2b are schematic diagrams of the fabrication process of the thermo-electric generator in the first embodiment of the invention.
Figure 2B:
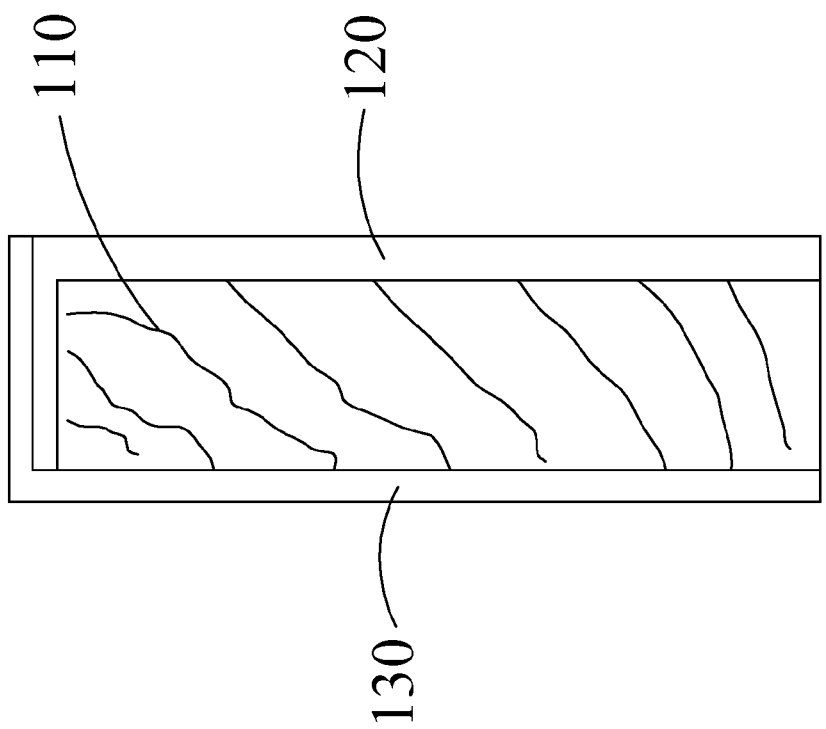

FIG. 1 is a cross-sectional diagram of the fabrication process of the thermo-electric generator in a first embodiment of the invention. Wherein the thermo-electric generator comprises an insulating substrate 110, a P-type thermo-electric thin-film layer 120 deposited on one side of said insulating substrate 110, and a N-type thermo-electric thin-film layer 130 deposited on the other side of said insulating substrate 110. Two electrodes 140 and 150 are respectively extracted from said P-type thermo-electric thin-film layer 120 and N-type thermo-electric thin-film layer 130. The structure shown in FIG. 2a is achieved by depositing a P-type thermo-electric thin-film layer 120 on one side of said insulating substrate 110, and the structure shown in FIG. 2b is further achieved by depositing a N-type thermo-electric thin-film layer 130 on the other side of said insulating substrate 110. The thermo-electric generator is formed by extracting electrodes 140 and 150 respectively from said P-type thermo-electric thin-film layer 120 and N-type thermo-electric thin-film layer 130 shown in FIG. 2b. Wherein said P-type thermo-electric thin-film layer 120 and N-type thermo-electric thin-film layer 130 are entirely overlap connected on one side of said insulating substrate 110.

Figure 3:
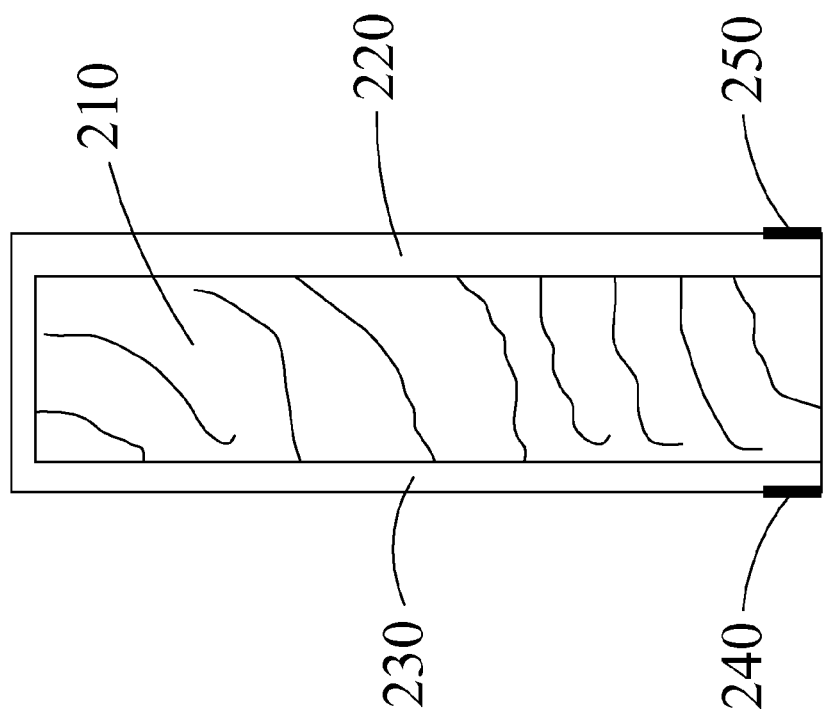
FIG. 3 is a cross-sectional diagram of the fabrication process of the thermo-electric generator in a second embodiment of the invention.
Figure 4A:
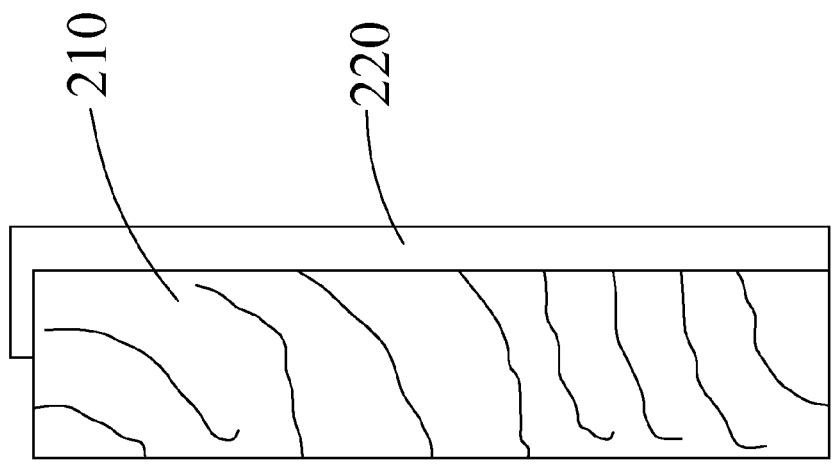
FIGS. 4a and 4b the schematic diagrams of the fabrication process of the thermo-electric generator in the second embodiment of the invention.
Figure 4B:
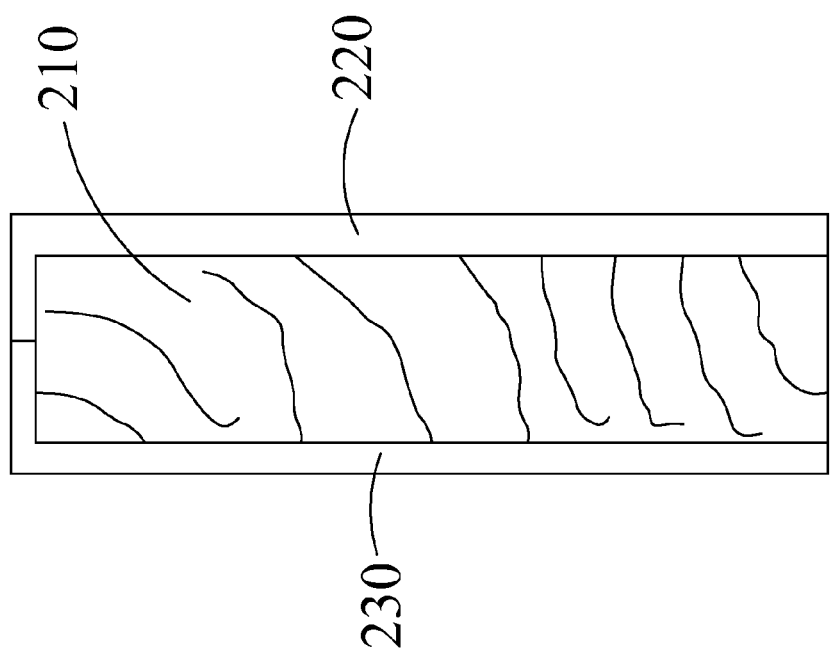

FIG. 3 is a cross-sectional diagram of the fabrication process of the thermo-electric generator in a second embodiment of the invention. Wherein the thermo-electric generator comprises an insulating substrate 210, a P-type thermo-electric thin-film layer 220 deposited on one side of said insulating substrate 210, and a N-type thermo-electric thin-film layer 230 deposited on the other side of said insulating substrate 210. Two electrodes 240 and 250 are respectively extracted from said P-type thermo-electric thin-film layer 220 and N-type thermo-electric thin-film layer 230. The structure shown in FIG. 4a is achieved by depositing a P-type thermo-electric thin-film layer 220 on one side of said insulating substrate 210, and the structure shown in FIG. 4b is further achieved by depositing a N-type thermo-electric thin-film layer 230 on the other side of said insulating substrate 210. Said P-type thermo-electric thin-film layer 220 and N-type thermo-electric thin-film layer 230 are deposited and connected on the exposed side of said insulating substrate 210. The thermo-electric generator is formed by extracting electrodes 240 and 250 respectively from said P-type thermo-electric thin-film layer 220 and N-type thermo-electric thin-film layer 230 shown in FIG. 4b.

The materials applied in the thermo-electric generator in the above-mentioned embodiments can be metal and semiconductor. Said P-type thermo-electric material and N-type thermo-electric can be two different metal materials, and the thermo-electric generator can be formed by depositing two different metal thin-film layers. The insulating substrates can be regular shapes, such as a rectangle or a square, or in any irregular shapes.

The shape of exposed side of the insulating substrates can be plane or curve.

For the above mentioned thermo-electric generator, its fabrication processes are simplified, the fabrication cost is reduced and the performance is highly improved.

With third and fourth embodiments, the fabrication processes of thermo-electric generator are described in details as below.

The Third Embodiment

The device for fabricating the thermo-electric generator in the third embodiment is a three-target magnetron sputtering coater. Selecting targets of metals Sb, Bi and Te, the purity of the target is 99.99%. Sb and Bi targets are set in the direct current target position respectively, and then Te target is set in the radio frequency target position. Ultrasonic wash is conducted on the substrate of common sodalime glass, and it is put in fixture in the deposition room. The fixture may further have apparatuses for intentional sheltering in the two ends and the sides, making the deposition of Sb and Te layer on the exposed side of insulating substrate 110 easy while sheltering other sides and setting the insulating substrate 110 in an specific angle. In the room temperature, during the deposition, deposition of Sb and Te layers is conducted on one side of the insulating substrate 110 through direct current sputtering and radio frequency sputtering. After subsequent heat treating, a N-type thermo-electric thin-film layer 130 with depth of 700 nm is formed, then annealing in the temperature 200 degree C. During the deposition, the background vacuum degree is $2.8 \times 10^{-4}$ Pa, the working vacuum degree is $6.1 \times 10^{-1}$ Pa, and the working gas is 99.99% pure Ar with a rate of flow of 50 sccm.

After the deposition of $Sb_2Te_3$ layer 120 on one side of the insulating substrate 110 and the deposition of $Bi_2Te_3$ layer 130 on the other side, the electrode is extracted from layer 120 and layer 130 respectively to form the main structure of the thermo-electric generator shown in FIG. 1 and FIG. 3.

Then the thin-film thermo-electric generator is made by scribing, racking, packaging and related subsequent procedures.

Several methods can be applied to make the P-type and N-type thermo-electric thin-film layers, such as vacuum evaporation, Molecule Beam Epitaxy (MBE), magnetron sputtering, sputtering deposition, Laser Deposition, electrochemical atomic layer epitaxy (ECALE), metal-organic chemical vapor deposition (MOCVD), and successive ionic layer adsorption and reaction (SILAR).

During the above-said fabrication process, the deposition of the P-type thermo-electric thin-film layer 120 can be carried before or after the deposition of the N-type thermo-electric thin-film layer 130.

The Fourth Embodiment

The device for fabricating the thermo-electric generator in the fourth embodiment is an ultrahigh vacuum sputtering deposition coater. Selecting targets of Seebeck index P-type metal Sb and N-type Bi, the purity of the target is 99.99%. Sb and Bi targets are set in the rotatable target position respectively, and then Te target is set in the radio frequency target position. Ultrasonic wash is conducted on the substrate of common sodalime glass, and it is put in fixture in the deposition room. The fixture may further have apparatuses for intentional sheltering in the two ends and the sides, making the deposition of Sb and Te layer on the exposed side of insulating substrate 110 easy while sheltering other sides and setting the substrate 110 in an specific angle. In the room temperature, during the deposition in FIG. 2, deposition of Sb thin-film layer 120 with depth of 300 nm is conducted on one side of the insulating substrate 110 through magnetron sputtering. During the deposition, the background vacuum degree is $4.5 \times 10^{-4}$ Pa, the working vacuum degree is $4.1 \times 10^{-2}$ Pa, and the working gas is 99.99% pure Ar with a rate of flow of 4 sccm. The parameters of magnetron deposition are as follows: the plate voltage is 1 KV, the anode voltage is 75 V, the accelerating voltage is 220 V, the cathode voltage is 7 V, the cathode current is 11 A, and the beam current is 14 mA.

After the deposition of Sb layer 120 on one side of the insulating substrate 110 and the deposition of Bi layer 130 on the other side, electrodes 140 and 150 are extracted from Sb layer 120 and Bi layer 130 respectively to form the main structure of the thermo-electric generator shown in FIG. 1 and FIG. 3.

Then the thin-film thermo-electric generator is made by scribing, racking, packaging and related subsequent procedures.

During the depositions in the other embodiments, the exposed areas of P-type and N-type materials on the insulating substrate can be partly overlapped. The depth of said substrate ranges from 0.1 mm to 100 mm, and may be thicker or thinner.

The methods for fabricating the above mentioned thermo-electric generator make the fabrication process simplified and cost-effective, and greatly improve the performance of the thermo-electric generator. The single thermo-electric generator can be connected in series in large numbers, and that can produce enough output voltage in condition of low temperature difference.

Thermo-electric phenomenon is reversible, and the semiconductor thermo-electric generation and refrigeration can be reversible. For a single PN junction, if the temperature difference is used for electricity generation, then the electricity can be used for refrigeration in the other end. Thus, the main thin-film thermo-electric generator structure can be the main structure of the thin-film thermo-electric cooler.

The invention may be embodied in other specific form without departing from the spirit or essential characteristics thereof. The present embodiments are therefore to be considered in all respects as illustrative and not restrictive. The scope of the invention being indicated by the appended claims rather than by the foregoing description and all changes which come within the meaning and range of equivalency of the claims are therefore intended to be embraced therein.

What is claimed is:

1. A method for fabricating a thermo-electric generator, comprising steps as follows:

putting an insulating substrate in a fixture in a deposition room;

exposing one side of the insulating substrate, sheltering all the other sides, setting the insulating substrate in an specific angle for deposition on an exposed side of the insulating substrate;

depositing a P-type thermo-electric thin-film layer on one side of the insulating substrate;

depositing a N-type thermo-electric thin-film layer on the other side of the insulating substrate;

connecting said P-type thermo-electric thin-film layer and said N-type thermo-electric thin-film layer on the exposed side of said insulating substrate; and deriving an electrode respectively from said P-type thermo-electric thin-film layer and said N-type thermo-electric thin-film layer to form a main structure of a thin-film thermo-electric generator.

2. The method according to claim 1, wherein a thickness range of said insulation substrate is 0.1 mm-100 mm, a thickness range of said P-type thermo-electric thin-film layer is 1 nm-10 μm, and a thickness range of said N-type thermo-electric thin-film layer is 1 nm-10 μm.

3. The method according to claim 1, wherein a shape of said insulation substrate is regular rectangle.

4. The method according to claim 1, wherein a shape of the exposed side of said insulation substrate is plane or curve.

* * * * *